United States Patent
Hong

(10) Patent No.: US 7,683,408 B2
(45) Date of Patent: Mar. 23, 2010

(54) IMAGE SENSOR

(75) Inventor: Ji Ho Hong, Hwaseong-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 273 days.

(21) Appl. No.: 11/923,362

(22) Filed: Oct. 24, 2007

(65) Prior Publication Data

US 2008/0303071 A1    Dec. 11, 2008

(30) Foreign Application Priority Data

Jun. 8, 2007    (KR) ...................... 10-2007-0055766

(51) Int. Cl.
*H01L 31/075* (2006.01)
(52) U.S. Cl. ................ 257/292; 257/458; 257/E31.032
(58) Field of Classification Search ................ 257/291, 257/292, 294, E31.032, E31.04, E31.061, 257/E31.13, 458
See application file for complete search history.

(56) References Cited

U.S. PATENT DOCUMENTS

| | | | | |
|---|---|---|---|---|
| 5,225,696 A | * | 7/1993 | Bahraman | 257/291 |
| 5,828,120 A | * | 10/1998 | Ishikawa | 257/499 |
| 6,121,670 A | * | 9/2000 | Hisamune | 257/623 |
| 2002/0145683 A1 | * | 10/2002 | Murade et al. | 349/43 |

* cited by examiner

*Primary Examiner*—Jerome Jackson, Jr.
*Assistant Examiner*—Paul A Budd
(74) *Attorney, Agent, or Firm*—Saliwanchik, Lloyd & Saliwanchik

(57) ABSTRACT

An image sensor and a fabricating method thereof are provided. A pixel area and a peripheral circuit area can have a step difference on a semiconductor substrate. A Complimentary Metal Oxide Semiconductor (CMOS) circuit can be provided on the pixel area, and an interlayer dielectric layer can be provided on the pixel area and the peripheral circuit area. A photodiode can be provided on the interlayer dielectric layer of the pixel area such that the top of the photodiode, or an intrinsic layer of the photodiode, is about even with the top of the interlayer dielectric layer of the peripheral circuit area.

11 Claims, 3 Drawing Sheets

IMAGE SENSOR

CROSS-REFERENCE TO RELATED APPLICATION

The present application claims the benefit under 35 U.S.C. §119 of Korean Patent Application No. 10-2007-0055766, filed Jun. 8, 2007, which is hereby incorporated by reference in its entirety.

BACKGROUND

Complimentary Metal Oxide Semiconductor (CMOS) image sensors typically include a photodiode and a Metal Oxide Semiconductor (MOS) transistor in each unit pixel. CMOS image sensors sequentially detect electric signals of each unit pixel in a switching mode to realize images.

A CMOS image sensor includes a photodiode area for receiving an optical signal and converting it into an electrical signal and a transistor area for processing the electrical signal.

A typical related art CMOS image sensor has a structure in which the photodiode and the transistor are horizontally arranged on the semiconductor substrate. Thus, much of the incident light does not strike the photodiode, leading to a low fill factor.

Thus, there exists a need in the art for an improved image sensor and manufacturing method thereof.

BRIEF SUMMARY

Embodiments of the present invention provide an image sensor and a manufacturing method thereof capable of vertically integrating a transistor circuit and a photodiode.

In an embodiment, an image sensor can include a pixel area and a peripheral circuit area on a semiconductor substrate, such that the upper surface of the semiconductor substrate of the pixel area is lower than the upper surface of the semiconductor substrate of the peripheral circuit area. A Complimentary Metal Oxide Semiconductor (CMOS) circuit can be provided on the pixel area, and an interlayer dielectric layer can be provided on the pixel area and the peripheral circuit area. A photodiode can be provided on the interlayer dielectric layer of the pixel area, wherein the upper surface of the photodiode or the upper surface of an intrinsic layer of the photodiode is about even with the upper surface of the interlayer dielectric layer of the peripheral circuit area.

In an embodiment, a method for manufacturing an image sensor can include: forming a pixel area and a peripheral circuit area on a semiconductor substrate, such that the upper surface of the semiconductor substrate of the pixel area is lower than the upper surface of the semiconductor substrate of the peripheral circuit area; forming a transistor circuit on the pixel area; forming an interlayer dielectric layer on the pixel area and the peripheral circuit area; and forming a photodiode on the interlayer dielectric layer of the pixel area, wherein an upper surface of the photodiode is about even with the upper surface of the interlayer dielectric layer in the peripheral circuit area.

DETAILED DESCRIPTION

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

Figure 5:
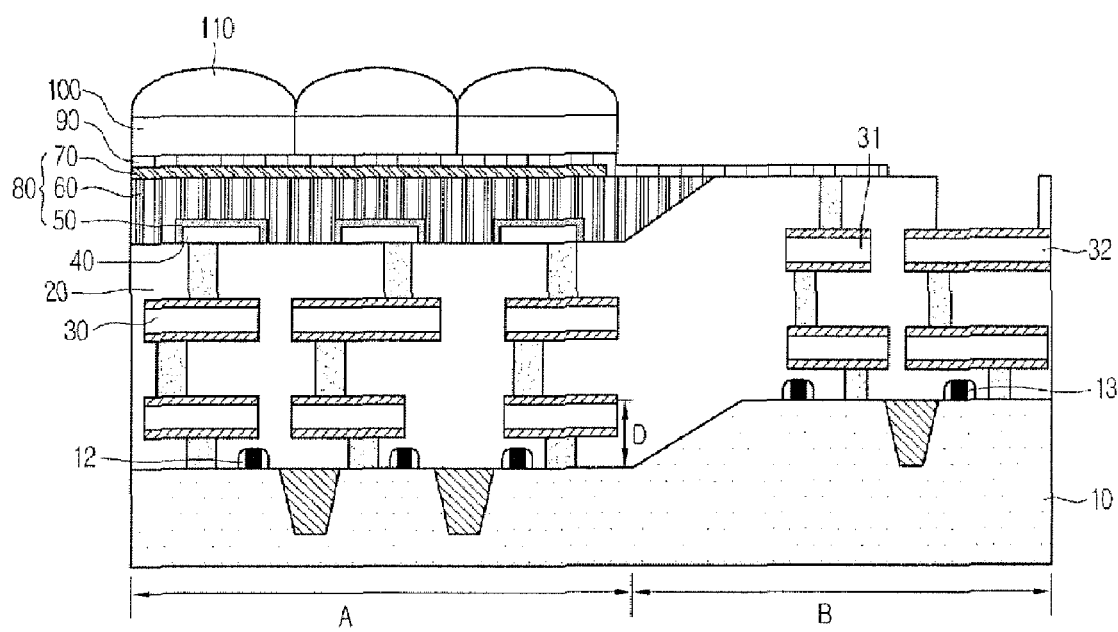

FIG. 5 is a cross-sectional view showing an image sensor according to an embodiment of the present invention.

In an embodiment, a pixel area A and a peripheral circuit area B can be provided on a semiconductor substrate 10 such that a step difference section D is created between the pixel area A and the peripheral circuit area B.

A portion of the semiconductor substrate 10 provided with the pixel area A can be lower than a portion of the semiconductor substrate 10 provided with the peripheral circuit area B.

Complementary Metal Oxide Semiconductor (CMOS) circuits 12 and 13 can be provided in the pixel area A and the peripheral circuit area B.

An interlayer dielectric layer 20 can be provided on both the pixel area A and the peripheral circuit area B.

Metal interconnections 30 and 31 can be provided in the interlayer dielectric layer 20 in both the pixel area A and the peripheral circuit area B. A pad 32 can be provided on the interlayer dielectric layer 20 in the peripheral circuit area B.

A photodiode 80 can be provided on the interlayer dielectric layer 20 in the pixel area A.

The photodiode 80 can include a first conductive-type conductive layer 50, an intrinsic layer 60, and a second conductive-type conductive layer 70.

In one embodiment, the intrinsic layer 60 of the photodiode 80 can be formed such that its upper surface is about even with the upper surface of the interlayer dielectric layer 20 in the peripheral circuit area B.

An upper electrode 90 can be formed on at least a portion of the photodiode 80 and on the interlayer dielectric layer 20 of the peripheral circuit area B.

A color filter 100 can be provided on the upper electrode of the pixel area A. Also, a microlens 110 can be provided on the color filter 100.

Figure 6:
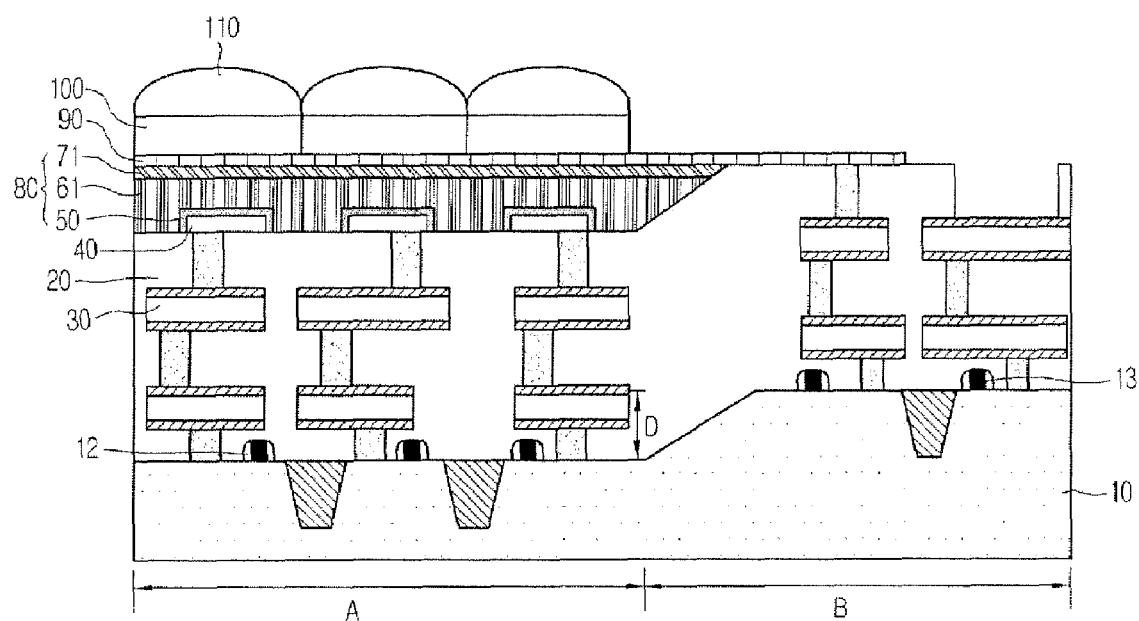

Referring to FIG. 6, in another embodiment, the second conductive-type conductive layer 71 of the photodiode 80 can be formed such that its upper surface is about even with the upper surface of the interlayer dielectric layer 20 in the peripheral circuit area B.

Figure 1:
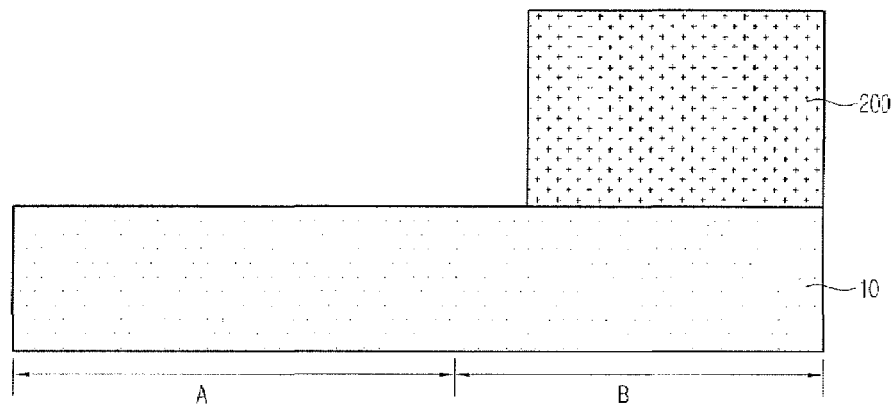
FIGS. 1 to 6 are cross-sectional views showing a method for manufacturing an image sensor according to an embodiment of the present invention.

Referring to FIG. 1, a photoresist pattern 200 can be formed on a semiconductor substrate 10 in order to form a pixel area A and a peripheral circuit area B. The semiconductor substrate 10 can be any suitable substrate known in the art, for example, a p-type substrate (p++ substrate). In an embodiment, a low-concentration p-type epitaxial layer (p-epi layer) can be formed in the semiconductor substrate 10.

The photoresist pattern 200 can expose at least a portion of the semiconductor substrate 10 provided with the pixel area A while covering at least a portion of the semiconductor substrate 10 provided with the peripheral circuit area B.

Figure 2:
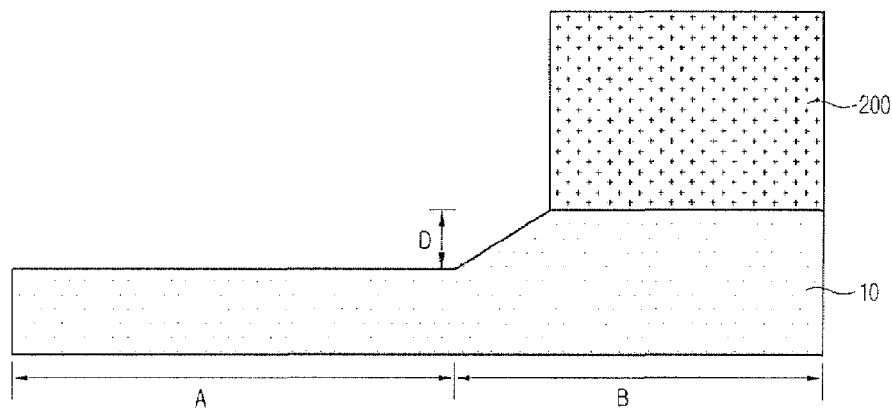

Referring to FIG. 2, the semiconductor substrate 10 can be etched using the photoresist pattern 200 as an etching mask. Accordingly, a step difference D can be created between the pixel area A and the peripheral circuit area B.

Thus, the semiconductor substrate 10 provided with the pixel area A can have a height lower than that of the semiconductor substrate 10 provided with the peripheral circuit area B.

A lens area that may be subsequently formed in the pixel area A can have a thickness which is about the same as the height of the step difference D. Thus, having the step difference D can help if color filters and microlenses are subsequently formed. If the step difference D is not formed in the semiconductor substrate 10 between the pixel area A and the peripheral circuit area B, the upper surface of a photodiode may be higher than the upper surface of the peripheral circuit area B, leading to difficulty in forming the color filter and microlens.

Accordingly, if the semiconductor substrate 10 provided with the pixel area A is formed lower than the semiconductor substrate 10 provided with the peripheral circuit area B, a color filter and a microlens may be subsequently formed more easily.

The semiconductor substrate 10 can be etched, for example, through a dry etching process or a wet etching process.

In one embodiment, the semiconductor substrate 10 can be etched through a dry etching process, and RF power or injected gas can be adjusted such that the step difference D between the pixel area A and the peripheral circuit area B can be inclined.

In another embodiment, the semiconductor substrate 10 can be etched through a wet etching process, and an amount of an etchant can be adjusted such that the step difference D between the pixel area A and the peripheral circuit area B can be inclined.

The photoresist pattern 200 can then be removed.

Figure 3:
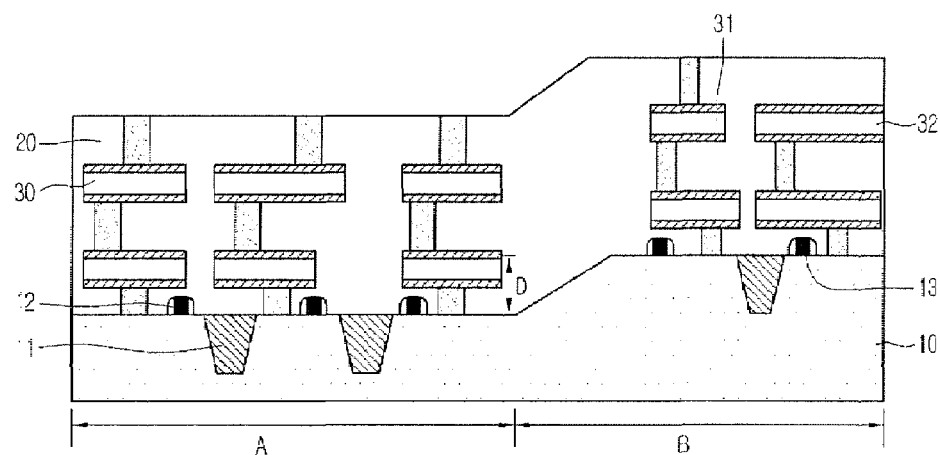

Referring to FIG. 3, an isolation layer 11 and CMOS circuits 12 and 13 can be formed on the semiconductor substrate 10 in the pixel area A and the peripheral circuit area B. The isolation layer 11 can be formed through, for example, a shallow trench isolation (STI) process.

CMOS circuits 12 can be formed in unit pixels in the pixel area A. CMOS circuits 13 can also be formed in the peripheral circuit area B.

The CMOS circuit 12 of the pixel area A can include, for example, a select transistor, a drive transistor, a reset transistor, and a transfer transistor to convert optical charges created by a photodiode into an electrical signal.

An interlayer dielectric layer 20 and metal interconnections 30 and 31 can be formed on the pixel area A and the peripheral circuit area B.

Since the pixel area A is lower than the peripheral circuit area B, a portion of the interlayer dielectric layer 20 formed on the pixel area A is lower than a portion of the interlayer dielectric 20 formed on the peripheral circuit area B.

The interlayer dielectric layer 20 can have any suitable structure known in the art, for example, a multi-layer structure. In an embodiment with a multi-layer interlayer dielectric layer 20, a plurality of metal interconnections 30 and 31 can be formed in the interlayer dielectric layer 20.

In an embodiment, the metal interconnections 30 and 31 can be formed together during a same process on the pixel area A and the peripheral circuit area B. In another embodiment, the metal interconnections 30 can be formed on the pixel area A separately from the metal interconnections being formed on the peripheral circuit area B.

A metal interconnection 30 of the pixel area A can be provided in each unit pixel such that each CMOS circuit 12 can be connected to a photodiode.

The metal interconnections 30 and 31 can be formed of metal, alloy, silicide, or any other suitable material known in the art. For example, the metal interconnections 30 and 31 can be formed of aluminum (Al), copper (Cu), or tungsten (W).

A pad 32 can be formed in the peripheral circuit area B when the metal interconnections 31 are formed.

Accordingly, after forming the interlayer dielectric layer 20 including the metal interconnections 30 and 31, the upper surface of the interlayer dielectric layer 20 in the pixel area A can be lower, by about the step difference D, than the upper surface of the interlayer dielectric layer 20 in the peripheral circuit area B.

Figure 4:
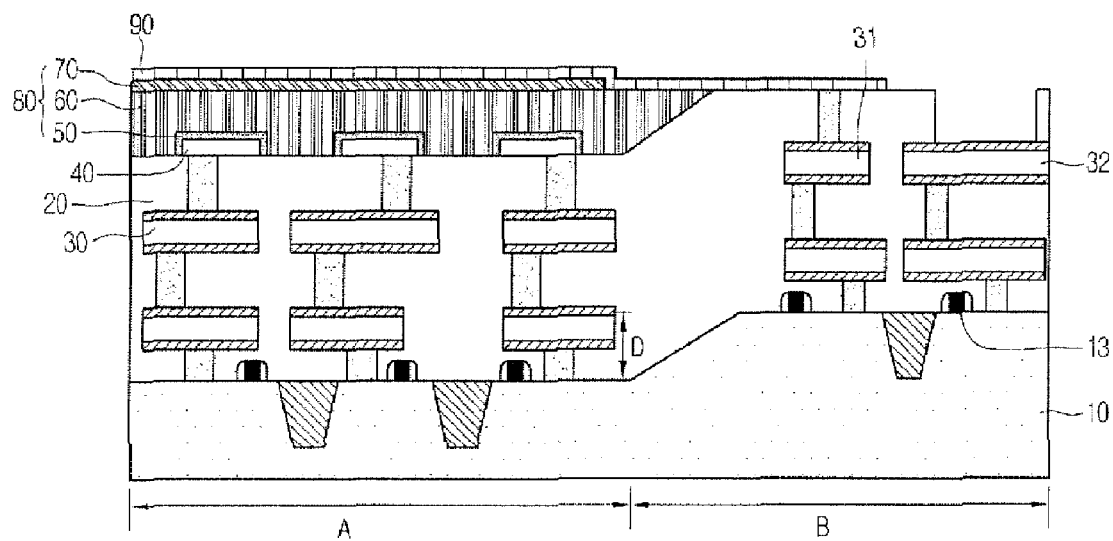

Referring to FIG. 4, in an embodiment, a lower electrode 40 can be formed on the interlayer dielectric layer 20 of the pixel area A such that the lower electrode 40 can be electrically connected to the metal interconnection 30. The lower electrode 40 can be formed of any suitable material known in the art, for example, chromium (Cr), titanium (Ti), titanium tungsten (TiW), or tantalum (Ta). In another embodiment, the lower electrode may be not formed.

A photodiode 80 can be formed on the interlayer dielectric layer 20 of the pixel area A.

The photodiode 80 can be formed on the interlayer dielectric layer 20 of the pixel area A such that the photodiode 80 can receive external light and convert it into an electrical charge. In an embodiment, the photodiode 80 can be a PIN diode.

A PIN diode can have a junction structure of p-type amorphous silicon, intrinsic amorphous silicon, and n-type amorphous silicon.

The performance of a photodiode is typically determined by its efficiency of receiving external light to convert it into electrical form and total charge capacitance. A related photodiode generates and preserves electric charges in a depletion region created in the hetero junction of P-N, N-P, N-P-N, and P-N-P. The P-I-N photodiode is an optical diode in which an intrinsic amorphous silicon layer can be joined between a p-type silicon layer and an n-type silicon layer. The intrinsic amorphous silicon layer can become a depletion region such that electric charges can be generated and preserved.

According to an embodiment of the present invention, a PIN diode can be employed as the photodiode 80, and the PIN diode can have a P-I-N structure, an N-I-P structure, or an I-P structure. For example, the PIN diode can have a P-I-N structure, and an n-type amorphous silicon layer, an intrinsic amorphous silicon layer, and a p-type amorphous silicon layer can be referred to as a first conductive-type conductive layer, an intrinsic layer, and a second conductive-type conductive layer, respectively. Of course, embodiments of the present invention are not limited thereto. For example, the p-type amorphous silicon layer can be the first conductive-type conductive layer, and the n-type amorphous silicon layer can be the second conductive-type conductive layer.

The first conductive-type conductive layer 50 can be formed on the interlayer dielectric layer 20 in the pixel region A. In one embodiment, the first conductive-type conductive layer 50 can also be formed to surround the lower electrode 40, if present.

In an embodiment, the first conductive-type conductive layer 50 can serve as an N layer of a PIN diode.

For example, the first conductive-type conductive layer 50 can be formed using N-doped amorphous silicon, such as amorphous Si:H (a-Si:H), a-SiGe:H, a-SiC, a-SiN:H, or a-SiO:H.

The first conductive-type conductive layer 50 can be formed through, for example, a chemical vapor deposition (CVD) process such as a plasma enhanced chemical vapor deposition (PECVD) process. In an embodiment, the first conductive-type conductive layer 50 includes N-doped amorphous silicon, which can be obtained by mixing $SiH_4$ with PH$_3$ and P$_2$H$_5$ and then depositing the mixture through a PECVD process at the temperature of about 100° C. to about 400° C.

In an embodiment, the first conductive-type conductive layer 50 can be formed on the upper portion of the metal interconnections 30 divided according to unit pixels, and the can photodiode 80 be divided according to the unit pixels.

The upper surface of the first conductive-type conductive layer 50 in the pixel area A can be lower than the upper surface of the interlayer dielectric layer 20 in the peripheral circuit are B.

The intrinsic layer 60 can be formed on the first conductive-type conductive layer 502. In an embodiment, the intrinsic layer 60 can serve as an I layer of a PIN diode.

The intrinsic layer 60 can be formed of amorphous silicon. For example, the intrinsic layer 60 an be formed using intrinsic amorphous silicon through a PECVD process using SiH$_4$.

In an embodiment, the intrinsic layer 60 can have a thickness that is about 10 times to about 1,000 times larger than the thickness of the first conductive-type conductive layer 50. The depletion region of a PIN diode can be enlarged as the thickness of the intrinsic layer 60 is increased, such that a large amount of optical charges can be generated and preserved.

The upper surface of the intrinsic layer 60 can be lower than or about even with the upper surface of the interlayer dielectric layer 20 of the peripheral circuit area B.

In an embodiment, a chemical mechanical polishing (CMP) process can be performed on the intrinsic layer 60 such that the upper surface of the intrinsic layer 60 is lower than or about even with the upper surface of the interlayer dielectric layer 20 of the peripheral circuit area B.

In addition, in an embodiment, the intrinsic layer 60 can be over etched after performing the CMP process.

Referring again to FIG. 4, a second conductive-type conductive layer 70 can be formed on the intrinsic layer 60.

The second conductive-type conductive layer 70 can serve as a P layer of a PIN diode.

The second conductive-type conductive layer 70 can be formed using, for example, P-doped amorphous silicon.

The second conductive-type conductive layer 70 can be formed through, for example, a CVD process, such as a PECVD process. For example, the second conductive-type conductive layer 70 can include P-doped amorphous silicon obtained by mixing SiH$_4$ with BH$_3$ or B$_2$H$_6$ and depositing the result through a PECVD process.

Thus, the photodiode 80 can include the first conductive-type conductive layer 50, the intrinsic layer 60, and the second conductive-type conductive layer 70 formed on the pixel area A.

The photodiode 80 can be electrically connected to the CMOS circuit 12 and the metal interconnection 30 on the pixel area A to achieve vertical integration.

An upper electrode 90 can be formed on the interlayer dielectric layer 20 including the photodiode 80.

The upper electrode 90 can be a transparent electrode with good light transmittance and conductivity characteristics. For example, the upper electrode 90 can be formed of indium tin oxide (ITO), cadmium tin oxide (CTO), zinc oxide (ZnO$_2$), or any other suitable material known in the art.

The upper electrode 90 can be formed on the photodiode 80 and at least a portion of the interlayer dielectric layer 20 including the metal interconnection 31 of the peripheral circuit area B, such that an electrical signal can be applied to the photodiode 80 and the metal interconnection 31 of the peripheral circuit area B.

The pad 32 formed on the interlayer dielectric layer 20 in the peripheral circuit area B can be exposed. In an embodiment, the pad 32 can be exposed after a color filter and/or a microlens is formed.

A color filter 100 can be formed on the upper electrode 90 over the photodiode 80.

A color filter 100 can be formed, for example, by coating a color filter layer on the upper electrode 90 and performing an exposure and development process using a pattern mask. A color filter 100 can be formed in each unit pixel to filter a predetermined color from incident light. Each color filter 100 can represent different colors, such as red, green, and blue.

A microlens 110 can be formed on the color filter 100.

The microlens 110 can be formed, for example, by performing a spin process with respect to a photoresist film for the microlens on the color filter 100. In an embodiment, the microlens 110 can be formed through a reflow process after subjecting the photoresist film to exposure and development processes.

In an embodiment, such as shown in FIG. 5, the upper surface of the intrinsic layer 60 of the photodiode 80 can be about even with the upper surface of the interlayer dielectric layer 20 of the peripheral circuit area B. In addition, since the second conductive-type conductive layer 70 and the upper electrode 90 can be relatively thin, the upper surface of the pixel area A can be close to even with the upper surface of the peripheral circuit area B.

Thus, the step difference D between the pixel area A and the peripheral circuit area B can be about the same as the thickness of the photodiode 80, such that the upper surface of the pixel area A can be about even with the upper surface of the peripheral circuit area B.

Accordingly, the color filter 100 and the microlens 110 can be easily formed on the photodiode 80.

In addition, since the color filter 100 and the microlens 110 can be formed on a substantially planarized surface, the color filter 100 and the microlens 110 can be formed in a desired shape.

Referring to FIG. 6, in an embodiment, the intrinsic layer 61 and the second conductive-type conductive layer 71 can be formed such that the upper surface of the second conductive-type conductive layer 71 is about even with the upper surface of the interlayer dielectric layer 20 of the peripheral circuit area B.

In this embodiment, after the intrinsic layer 60 is formed on the first conductive-type conductive layer 50, the intrinsic layer 60 can be over etched through a CMP process such that the upper surface of the intrinsic layer 61 can be lower than the upper surface of the interlayer dielectric layer 20 of the peripheral circuit area B.

In this embodiment, when the second conductive-type conductive layer 70 is formed on the intrinsic layer 61, a CMP process can be performed on the second conductive-type conductive layer 70 such that the upper surface of the second conductive-type conductive layer 71 can be about even with the upper surface of the interlayer dielectric layer 20 of the peripheral circuit area B.

Accordingly, in this embodiment, the upper surface of the photodiode 80, including the first conductive-type conductive layer 50, the intrinsic layer 61, and the second conductive-type conductive layer 71, can be about even with the upper surface of the interlayer dielectric layer 20 of the peripheral circuit area B.

Then, the upper electrode 90 can be formed on the photodiode 80 and at least a portion of the interlayer dielectric layer 20 of the peripheral circuit area B. The color filter 100 can be formed on the upper electrode 90 over the photodiode 80, and the microlens 110 can be formed on the color filter 100.

Accordingly, since the color filter 100 and the microlens 110 can be formed on a planarized surface in which the step difference D between the pixel area A and the peripheral circuit area B has been reduced, the process for forming the color filter 100 and the microlens 110 can be performed more easily.

According to an embodiment of the present invention, a photodiode having a PIN structure can be formed on the semiconductor substrate, providing vertical integration of the transistor circuit and the photodiode. Accordingly, the fill factor can approach 100%.

In addition, embodiments of the present invention can provide higher sensitivity than related art image sensors in the same pixel size.

Also, each unit pixel of an image sensor according to the present invention can realize complex circuits without reducing sensitivity.

Furthermore, the color filter and the microlens can be easily formed since the upper surface of the photodiode is about even with the upper surface of the interlayer dielectric layer of the peripheral circuit area.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor, comprising:
    a semiconductor substrate having a pixel area and a peripheral circuit area, wherein an upper surface of the semiconductor substrate of the peripheral circuit area is higher than an upper surface of the semiconductor substrate of the pixel area;
    a Complimentary Metal Oxide Semiconductor (CMOS) circuit on the semiconductor substrate in the pixel area;
    an interlayer dielectric layer on the semiconductor substrate in the pixel area and the peripheral circuit area; and
    a photodiode on the interlayer dielectric layer of the pixel area,
    wherein the photodiode comprises an intrinsic layer, and wherein an upper surface of the photodiode or an upper surface of the intrinsic layer of the photodiode is about even with an upper surface of the interlayer dielectric layer of the peripheral circuit area.

2. The image sensor according to claim 1, further comprising a CMOS circuit on the semiconductor substrate in the peripheral circuit area.

3. The image sensor according to claim 1, further comprising a pad and a metal interconnection passing through the interlayer dielectric layer.

4. The image sensor according to claim 1, wherein a portion of an upper surface of the interlayer dielectric layer of the pixel area is lower than a portion of the upper surface of the interlayer dielectric layer of the peripheral circuit area.

5. The image sensor according to claim 1, wherein the photodiode further comprises a first conductive-type conductive layer under the intrinsic layer and a second conductive-type conductive layer on the intrinsic layer.

6. The image sensor according to claim 5, wherein an upper surface of the second conductive-type conductive layer of the photodiode is about even with the upper surface of the interlayer dielectric layer of the peripheral circuit area.

7. The image sensor according to claim 1, further comprising a lower electrode on the interlayer dielectric layer below the photodiode.

8. The image sensor according to claim 1, wherein the upper surface of the intrinsic layer of the photodiode is about even with the upper surface of the interlayer dielectric layer of the peripheral circuit area.

9. The image sensor according to claim 1, further comprising an upper electrode on the photodiode and at least a portion of the interlayer dielectric layer of the peripheral circuit area.

10. The image sensor according to claim 9, further comprising:
    a color filter on the upper electrode over the photodiode; and
    a microlens on the color filter.

11. The image sensor according to claim 1, wherein the photodiode is a PIN diode, a NIP diode, or an IP diode.

* * * * *